United States Patent
Kim et al.

(10) Patent No.: US 9,690,519 B2
(45) Date of Patent: Jun. 27, 2017

(54) SOLID STATE DRIVE CARD AND AN ELECTRONIC SYSTEM INCLUDING THE SAME

(71) Applicant: Samsung Electronics Co., Ltd., Suwon-si, Gyeonggi-do (KR)

(72) Inventors: Min-sang Kim, Hwaseong-si (KR); Yun-chong Hwang, Seoul (KR); Kyu-dong Kim, Yongin-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 326 days.

(21) Appl. No.: 14/514,335

(22) Filed: Oct. 14, 2014

(65) Prior Publication Data

US 2015/0106553 A1    Apr. 16, 2015

(30) Foreign Application Priority Data

Oct. 15, 2013  (KR) .......................... 10-2013-0122952

(51) Int. Cl.
| | |
|---|---|
| *G06F 13/12* | (2006.01) |
| *G06F 13/00* | (2006.01) |
| *G06F 3/06* | (2006.01) |
| *G11C 5/04* | (2006.01) |
| *G06F 13/40* | (2006.01) |

(52) U.S. Cl.
CPC ............ *G06F 3/068* (2013.01); *G06F 3/0607* (2013.01); *G06F 3/0626* (2013.01); *G06F 3/0658* (2013.01); *G06F 3/0679* (2013.01); *G11C 5/04* (2013.01); *G06F 13/4063* (2013.01)

(58) Field of Classification Search
None
See application file for complete search history.

(56) References Cited

U.S. PATENT DOCUMENTS

| | | | |
|---|---|---|---|
| 5,609,490 | A | 3/1997 | Beesch et al. |
| 5,649,224 | A | 7/1997 | Scheer |
| 6,402,558 | B1 | 6/2002 | Hung-Ju et al. |
| 7,335,039 | B2 | 2/2008 | Wang |
| 7,364,466 | B2 | 4/2008 | Yen |
| 7,376,781 | B2 | 5/2008 | Lee et al. |
| 7,657,687 | B2 | 2/2010 | Ootsuka et al. |
| 7,831,755 | B2 | 11/2010 | Yun et al. |

(Continued)

FOREIGN PATENT DOCUMENTS

| | | |
|---|---|---|
| JP | 2002117924 A | 4/2002 |
| JP | 2007299157 A | 11/2007 |

*Primary Examiner* — David E Martinez
(74) *Attorney, Agent, or Firm* — Renaissance IP Law Group LLP

(57) ABSTRACT

Provided are a solid state drive (SSD) card and an electronic system including the same. The electronic system includes a main board to which an input device and an output device are connected. A central processing unit (CPU) and a platform hub (PH) are provided on the main board. The PH is electrically connected to a hybrid interface socket. The hybrid interface socket includes a secure digital (SD) card interface and a non-SD card interface. When the SSD card and the electronic system including the same are used, a storage capacity may be conveniently upgraded to a higher capacity. Also, since the hybrid interface socket is provided in place of a conventional SD card socket, additional space is not required and thus space may be efficiently used.

13 Claims, 15 Drawing Sheets

(56) References Cited

U.S. PATENT DOCUMENTS

| | | |
|---|---|---|
| 8,051,229 B2 | 11/2011 | Hubert et al. |
| 8,065,446 B2 | 11/2011 | Kang et al. |
| 8,190,206 B2 | 5/2012 | Lasser et al. |
| 8,215,991 B2 | 7/2012 | Bryant-Rich |
| 2005/0215125 A1 | 9/2005 | Matsumoto et al. |
| 2007/0079065 A1* | 4/2007 | Bonella ............... G06F 13/405 711/113 |
| 2008/0228973 A1 | 9/2008 | Lee |
| 2008/0248692 A1 | 10/2008 | Ni et al. |
| 2010/0279520 A1 | 11/2010 | Tsai |
| 2013/0013836 A1 | 1/2013 | Pinto et al. |

* cited by examiner

SOLID STATE DRIVE CARD AND AN ELECTRONIC SYSTEM INCLUDING THE SAME

CROSS-REFERENCE TO RELATED APPLICATIONS

This application claims the benefit of Korean Patent Application No. 10-2013-0122952, filed on Oct. 15, 2013, in the Korean Intellectual Property Office, the disclosure of which is incorporated herein in its entirety by reference.

BACKGROUND

The inventive concept relates to a solid state drive (SSD) card and an electronic system including the same, and more particularly, to an SSD card that may allow convenient storage capacity, an useful upgrade path, efficient space utilization, and an electronic system including the same.

As consumer demand for miniaturized and lightweight electronic systems increases, manufacturers of electronic systems continue to integrate component parts, for example, into unibody systems. Such efforts often lead to inconveniences for users. For example, other component parts integrated with a storage device might need to be replaced in order to accommodate the increased storage capacity, thus inconveniencing users and increasing overall system cost.

In particular, component part upgrading can be inconvenient and costly to both users and manufactures, which degrades the user experience, and causes disadvantages to the manufactures. Despite the rapid advancement of electronic system specifications due to rapid technology development, improvements are nevertheless needed.

SUMMARY

The inventive concept provides an electronic system that allows convenient storage capacity upgrade and efficient space utilization.

The inventive concept also provides a solid state drive (SSD) card that allows convenient storage capacity upgrading and efficient space utilization.

According to an aspect of the inventive concept, there is provided an electronic system including a main board to which an input device and an output device are connected. A central processing unit (CPU) and a platform hub (PH) may be provided on the main board. The PH may be electrically connected to a hybrid interface socket. Moreover, the hybrid interface socket may include a secure digital (SD) card interface and a non-SD card interface.

The non-SD card interface of the hybrid interface socket may comprise a solid state drive (SSD) card interface. The hybrid interface socket is configured to receive an SSD card comprising a first surface and a second surface as two opposite main surfaces such that the SSD card is electrically communicable with the SSD card interface.

The SD card interface may be provided at a side opposite to the second surface of the SSD card. The SSD card interface may be provided at a side opposite to the first surface of the SSD card.

The system may further comprise the SSD card inserted into the hybrid interface socket. The second surface of the SSD card may be opposite to the SD card, the first surface of the SSD card may comprise SSD input/output terminals, and the SSD input/output terminals may be electrically communicably connected to the SSD card interface.

The hybrid interface socket may comprise a recess portion configured to receive a protrusion portion of the SSD card that protrudes to a side surface or a front surface of the SSD card in an insertion direction of the SSD card, and the SSD card interface may be provided at the recess portion.

The SSD card may comprise the protrusion portion provided at the side surface or the front surface of the SSD card in the insertion direction of the SSD card into the hybrid interface socket. SSD input/output terminals may be provided on at least one of a first surface and a second surface of the protrusion portion. The SSD input/output terminals may be electrically communicable with the SSD card interface.

The hybrid interface socket may comprise the SSD card interface. The SSD card interface may be configured to be contactable with a side surface or a front surface of the SSD card.

The SSD card may comprise SSD input/output terminals provided at a side surface of the SSD card. The SSD input/output terminals may be electrically communicable with the SSD card interface.

The SSD card interface may comprise pins that are insertable into the side surface or the front surface of the SSD card in an insertion direction of the SSD card into the hybrid interface socket. The SSD card may comprise holes which are provided at the side surface of the SSD card in the insertion direction of the SSD card into the hybrid interface socket and into which the pins of the SSD card interface are insertable. The SSD input/output terminals may be provided in the holes.

The SD card interface may be electrically connected to the platform hub through a first route. The non-SD card interface may be electrically connected to the platform hub through a second route.

The SD card interface may be electrically connected to the platform hub through a Universal Serial Bus (USB) bridge chip. An interface for connecting the non-SD card interface to the platform hub may conform to Serial Advanced Technology Attachment (SATA) standards or Peripheral Component Interconnection (PCI) standards.

The SD card interface and the non-SD card interface may be configured to share a power terminal.

According to another aspect of the inventive concept, there is provided a solid state drive (SSD) card including a package substrate, a plurality of nonvolatile memories stacked on the package substrate, a controller configured to control data input/output to and from the plurality of nonvolatile memories, a dynamic random access memory (DRAM) device connected to the controller to buffer data, and a molding sealing member disposed to cover the plurality of nonvolatile memories and the controller. The SSD card may further comprise SSD input/output terminals configured to be connectable to an SSD card interface that has a different configuration than a secure digital (SD) card interface.

According to another aspect of the inventive concept, there is provided a method for providing a hybrid interface socket that is compatible with a secure digital (SD) card and a solid state drive (SSD) card. The method may comprise providing an SSD card interface at a side opposite to a first surface of the SSD card, providing an SD card interface at a side opposite to a second surface of the SSD card, receiving, by the hybrid interface socket, the SSD card, electrically connecting the SSD card to the SSD card interface, receiving, by the hybrid interface socket, the SD card, and electrically connecting the SD card to the SD card interface. The method may further comprise sharing, by the SSD card interface and the SD card interface, a power terminal.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
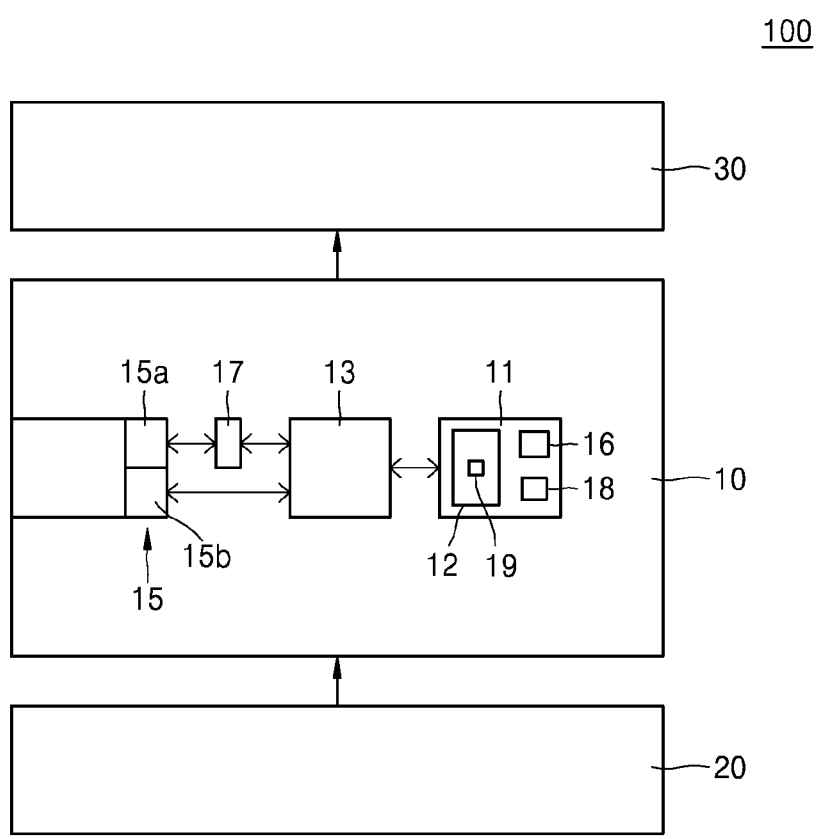
FIG. 1 is a conceptual block diagram illustrating an electronic system according to an embodiment of the inventive concept.

As used herein, the term "and/or" includes any and all combinations of one or more of the associated listed items. Expressions such as "at least one of," when preceding a list of elements, modify the entire list of elements and do not modify the individual elements of the list.

Hereinafter, exemplary embodiments of the inventive concept will be described in detail with reference to the accompanying drawings. The inventive concept may, however, be embodied in many different forms and should not be construed as being limited to the embodiments set forth herein; rather, these embodiments are provided so that this disclosure will be thorough and complete, and will fully convey the inventive concept to those of ordinary skill in the art. Like reference numerals denote like elements throughout the specification and drawings. In addition, since various elements or regions are schematically illustrated in the drawings, embodiments of the inventive concept are not limited by relative sizes and distances illustrated in the drawings.

Although terms such as "first" and "second" may be used herein to describe various elements or components, these elements or components should not be limited by these terms. These terms are only used to distinguish one element or component from another element or component. For example, a first element may be termed a second element, and, similarly, a second element may be termed a first element, without departing from the scope of the inventive concept.

The terminology used herein is for the purpose of describing particular embodiments only and is not intended to limit the inventive concept. As used herein, the singular forms "a," "an," and "the" are intended to include the plural forms as well, unless the context clearly indicates otherwise. It will be understood that terms such as "comprise," "include," and "have," when used herein, specify the presence of stated features, integers, steps, operations, elements, components, or combinations thereof, but do not preclude the presence or addition of one or more other features, integers, steps, operations, elements, components, or combinations thereof.

Unless otherwise defined, all terms (including technical and scientific terms) used herein have the same meaning as commonly understood by those of ordinary skill in the art to which the inventive concept pertains. It will also be understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a conceptual block diagram illustrating an electronic system 100 according to an embodiment of the inventive concept.

Referring to FIG. 1, a central processing unit (CPU) 11 and a platform hub (PH) 13 may be provided on a main board 10.

The CPU 11 may control an overall operation of the electronic system 100 and control a signal flow between internal blocks of the electronic system 100. The CPU 11 may include an arithmetic and logic unit (ALU) 12, a control unit 16, and/or one or more registers 18. The ALU 12 may perform arithmetic, logic and shift operations by using data stored in a memory unit 19 and then return results thereof to the memory unit 19. The control unit 16 may control and monitor an input unit 20, an output unit 30, the memory unit 19, and/or the ALU 12, and may sequentially decode commands stored in a main memory unit. The control unit 16 may provide results thereof to the ALU 12. The one or more registers 18 may temporarily store process data or process results.

An input device 20 may transfer input signals related to various numerals, characters, and input signals related to setting of respective functions of the electronic system 100 and control of the respective functions to the CPU 11. To this end, the input device 20 may include input keys (not shown) for inputting numeral and character information, and functions keys (not shown) for setting or controlling the respective functions of the electronic system 100. The function keys may include a shortcut key, a side key, and an arrow key set to perform a specific function. For example, in addition to inputting numeral and character information, the input device 20 may transfer a synchronization period setting request signal, a synchronization period selection signal, and a synchronization period setting completion signal to the CPU 11. The input device 20 may include at least one or any combination of a keyboard, a mouse, a scanner, a touchpad, a touchscreen, and a keypad according to a type of the electronic system 100.

An output device 30 may display various menus of the electronic system 100, information input by a user, or information to be provided to the user. For example, the output device 30 may provide one or more screens depending on the use states of the electronic system 100, for example, such as a program execution screen, a standby screen, a message generation screen, and/or a call screen. The output device 30 may include a liquid crystal display (LCD), an organic light-emitting display (OLED), and/or an active matrix organic light-emitting display (AMOLED). When the output device 30 is provided in the form of a touchscreen, the output device 30 may also function as the input device 20.

The PH 13 can manage displaying, real-time clocking, and data input/output between the CPU 11 and an input/output controller. The PH 13 may include some functions of a northbridge, such as clocking, and all functions of a southbridge. For example, the PH 13 may be a platform controller hub (PCH).

The electronic system 100 includes a hybrid interface socket 15 that is electrically connected to the PH 13. The hybrid interface socket 15 may include a secure digital (SD) card interface 15a and a non-SD card interface 15b.

The SD card interface 15a may be configured to connect with an SD card and communicate data with the SD card. The SD card interface 15a is known from standards, and thus a detailed description thereof will be omitted herein.

The non-SD card interface 15b may be configured to be compatible with a nonvolatile memory card that is incompatible with an SD card and has a different input/output terminal configuration than the SD card. For example, the nonvolatile memory card may be an SSD card that is described in detail below.

Although FIG. 1 illustrates that the SD card interface 15a and the non-SD card interface 15b are spatially independent of each other, the SD card interface 15a and the non-SD card interface 15b may spatially overlap with each other. For example, some of the terminals used in the SD card interface 15a may be used for the non-SD card interface 15b. By way of another example, some of the terminals used in the non-SD card interface 15b may be used for the SD card interface 15a.

A Universal Serial Bus (USB) bridge chip 17 may be interposed between the SD card interface 15a and the PH13. The USB bridge chip 17 refers to a semiconductor device that is interposed to connect a device that does not conform to a USB interface. Specifically, the USB bridge chip 17 may be a protocol conversion integrated circuit (IC) chip that is used to connect an SD card, which is connected through the SD card interface 15a, to the USB interface. For example, the USB bridge chip 17 may be installed by using a USB controller IC and a general-purpose one-chip microcomputer. The USB bridge chip 17 may perform a predetermined process by using firmware stored in an internal read-only memory (ROM). Alternatively or in addition, the USB bridge chip 17 may perform a predetermined process by developing firmware, which is stored in an external ROM and/or in an internal random-access memory (RAM). For example, a function for operating a memory device, such as an SD card, as a device of a USB mass memory device standard may be pre-stored as firmware stored in an internal ROM.

The USB bridge chip 17 is not interposed between the non-SD card interface 15b and the PH 13. That is, the non-SD card interface 15b may be directly connected to the PH 13, and routes for the connection may be provided on the main board 10.

When the non-SD card interface 15b is electrically connected to the PH 13 through the USB bridge chip 17 (like the SD card interface 15a), the speed of communication with an SD card may decrease since a considerable time is taken for data conversion in the USB bridge chip 17. On the other hand, when the non-SD card interface 15b is electrically connected to the PH 13 directly without passing through the USB bridge chip 17, the speed of communication with an SD card does not decrease, thus providing a high communication speed.

Figure 2:
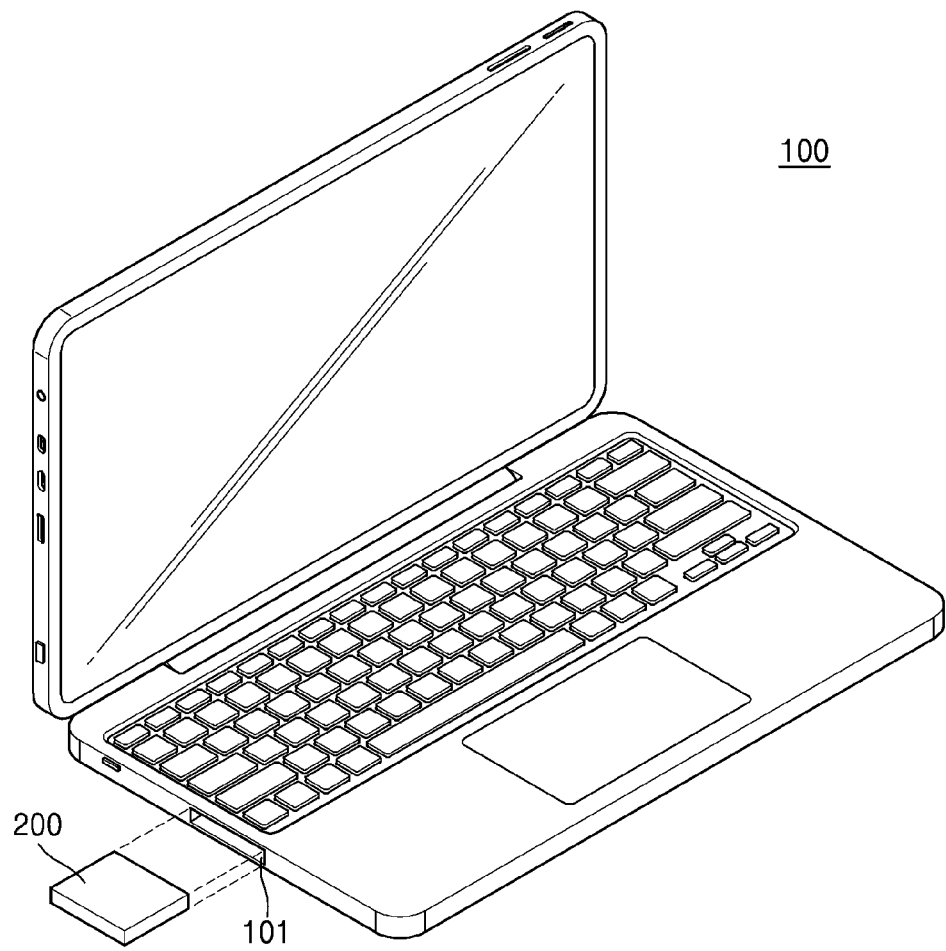
FIG. 2 is a perspective view illustrating a notebook personal computer (PC) as an example of the electronic system according to an embodiment of the inventive concept.

FIG. 2 is a perspective view illustrating a notebook personal computer (PC) as an example of the electronic system 100 according to an embodiment of the inventive concept.

Referring to FIG. 2, a slot 101 into which a memory card such as an SD card is insertable may be provided at one side portion of the electronic system 100. The hybrid interface socket 15 illustrated in FIG. 1 may be provided in the slot 101.

In this case, an SD card may be inserted into the hybrid interface socket 15, and a non-SD card 200 may be inserted into the hybrid interface socket 15. The non-SD card 200 may be a memory card of a different standard, or may be a solid state drive (SSD) card 200 herein. The SSD card 200 will be described in further detail below with reference to the drawings.

When the hybrid interface socket 15 is configured to support the SSD card 200, the non-SD card interface may be an SSD card interface.

While FIG. 2 illustrates an example in which the electronic system 100 is a notebook PC, it will be understood that the electronic system 100 may be a desktop PC, a smart phone, a tablet PC, a portable multimedia player (PMP), a navigation system, a flat-panel display device such as a flat-panel display television, or the like.

Figure 3A:
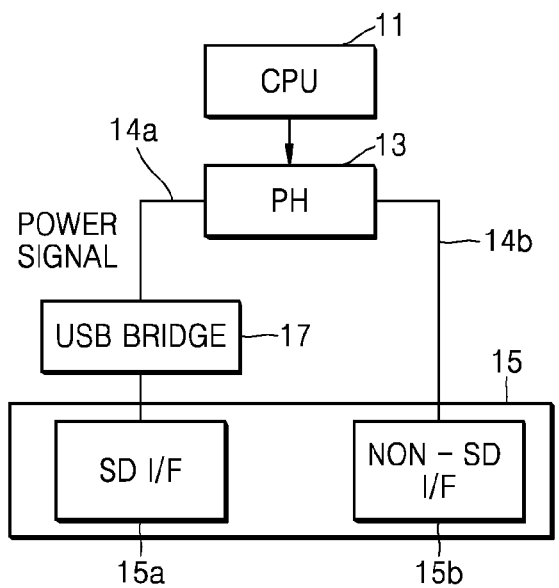
FIGS. 3A and 3B are conceptual block diagrams illustrating a connection between a central processing unit (CPU) and a hybrid interface socket of the electronic system according to an embodiment of the inventive concept.
Figure 3B:
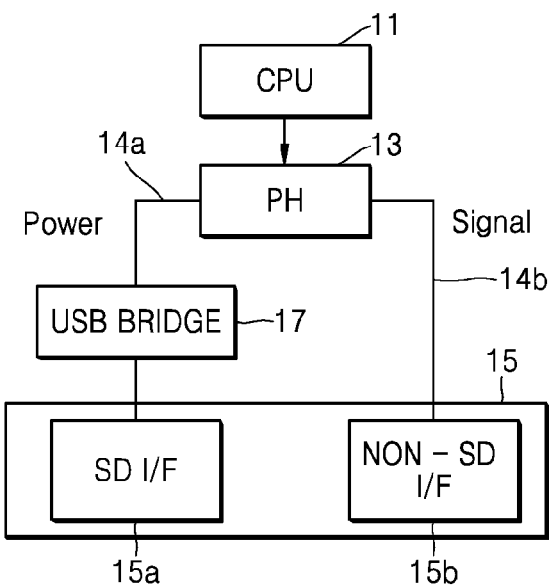

FIGS. 3A and 3B are conceptual block diagrams illustrating a connection between the CPU 11 and the hybrid interface socket 15 of the electronic system 100 according to an embodiment of the inventive concept. Reference is now made to FIGS. 3A and 3B.

FIG. 3A conceptually illustrates a case where an SD card can be inserted into the hybrid interface socket 15 through the SD card interface 15a. Referring to FIG. 3A, an SD card is electrically connected to the PH 13 through the SD card interface 15a along a first route 14a. The USB bridge chip 17 is interposed between the PH 13 and the SD card interface 15a. As described above, since the USB bridge chip 17 is interposed between the PH 13 and the SD card interface 15a, a relatively high communication speed is provided.

In this case, the SD card may communicate all signals as well as power with the PH 13 through the SD card interface 15a. A signal transmitted to the PH 13 may be transferred to the CPU 11 after passing through a proper process.

FIG. 3B conceptually illustrates a case where a non-SD card such as an SSD card can be inserted into the hybrid interface socket 15 through the non-SD card interface 15b. Referring to FIG. 3B, the non-SD card may be electrically connected directly to the PH 13 through the non-SD card interface 15b along a second route 14b.

For example, a method of connecting the non-SD card directly to the PH13 through the non-SD card interface 15b may conform to Serial Advanced Technology Attachment (SATA) standards or Peripheral Component Interconnection (PCI) standards.

When the connection between the non-SD card interface 15b and the PH 13 conforms to SATA standards, the SATA standards may include one or more SATA standards such as SATA-1, SATA-2, SATA-3, and/or external SATA (e-SATA). Also, the connection between the non-SD card interface 15b and the PH 13 may include an interface conforming to Parallel Advanced Technology Attachment (PATA) standards or Small Computer System Interface (SCSI) standards. The PATA standards may include all Integrated Drive Electronics (IDE) standards such as IDE and enhanced-IDE (E-IDE). The disclosure of serial ATA revision 2.6, which was published on Feb. 15, 2007 by the Serial ATA International Organization, is incorporated herein in its entirety by reference.

Also, when the connection between the non-SD card interface 15b and the PH 13 conforms to PCI standards, the PCI standards may include standards such as PCI Conventional, PCI-X, PCI Express, and Mini PCI.

As described above with reference to FIG. 1, the SD card interface 15a and the non-SD card interface 15b may be independent of each other, or may partially overlap with each other. FIG. 3B illustrates an embodiment in which the SD card interface 15a and the non-SD card interface 15b are configured to share a power terminal. Since the SD card interface 15a and the non-SD card interface 15b shares a power terminal, the non-SD card connected to the non-SD card interface 15b may communicate only signals with the PH 13.

The non-SD card may receive power through the SD card interface 15a and the USB bridge chip 17 along the first route 14a. However, since power need not be related to speed, the data communication speed of the non-SD card does not decrease. Therefore, the non-SD card may communicate with the PH 13 while maintaining a high communication speed.

Figure 4A:
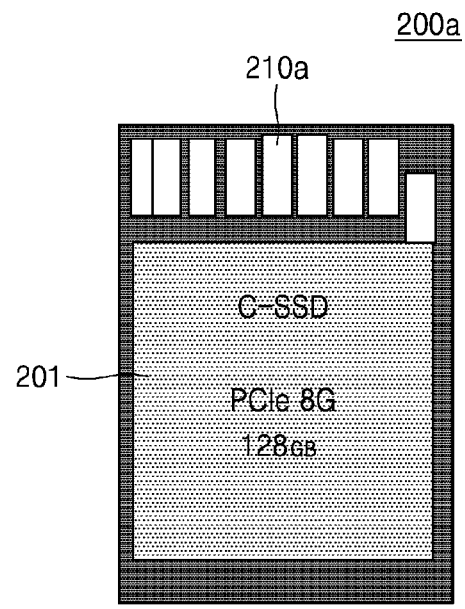
FIGS. 4A and 4B are respectively a top view and a bottom view illustrating a non-secure digital (non-SD) card according to an embodiment of the inventive concept.
Figure 4B:
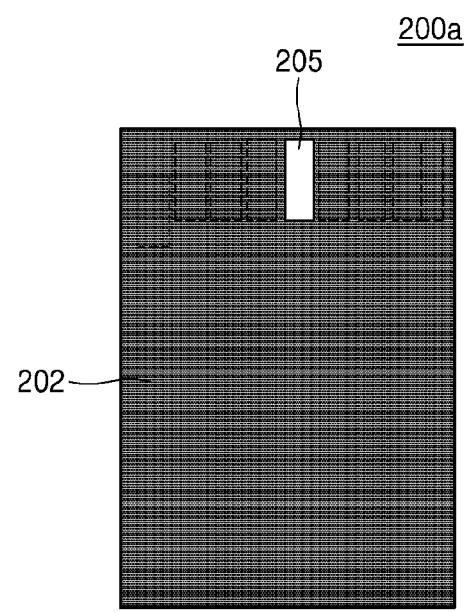

FIGS. 4A and 4B are respectively a top view and a bottom view illustrating a non-SD card according to an embodiment of the inventive concept.

Referring to FIG. 4A, SSD input/output terminals 210a may be provided on a first surface 201 that is a main surface of an SSD card 200a. The SSD input/output terminals 210a may have a different configuration than SD card terminals. Some of the SSD input/output terminals 210a may be power terminals and/or ground terminals.

Referring to FIG. 4B, a power terminal 205 of an SSD card may be provided on a second surface 202 that is opposite to the first surface 201 of the SSD card 200a. The configuration of terminals of an SD card can be the same as illustrated by a dotted line of FIG. 4B. A power terminal thereof may be located at the same position as the power terminal 205 of the SSD card 200a. Since the power terminal 205 of the SSD card 200a is located at the same position as the power terminal of the SD card, a power terminal of an SD card interface 215a (see FIG. 4C) may be shared. An example of sharing the power terminal is described herein. Alternatively or in addition, other terminals such as a ground terminal and/or a clock terminal may be shared. According to another embodiment, a signal terminal may be excluded from the SSD card 200a.

The embodiment of FIGS. 4A and 4B illustrates an example in which the SSD input/output terminals 210a are provided at an opposite surface with respect to the power terminal 205. It will be understood, however, that embodiments of the inventive concept are not limited thereto. Regarding an insertion direction, the input/output terminals of the SSD card may be provided at an opposite surface with respect to a surface at which the input/output terminals of the SD card are provided.

Figure 4C:
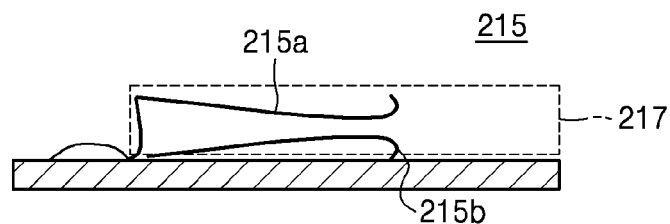
FIG. 4C is a side cross-sectional view illustrating a hybrid interface socket according to an embodiment of the inventive concept.

FIG. 4C is a side cross-sectional view illustrating a hybrid interface socket 215 according to an embodiment of the inventive concept. Referring to FIG. 4C, an SD card interface 215a may be provided in a housing 217 represented by a dotted line. The SD card interface 215a may be configured to allow elastic connection in order to provide close contact when an SD card can be inserted thereinto.

Also, an SSD card interface 215b may be provided as a non-SD card interface at an opposite side with respect to the SD card interface 215a. The SSD card interface 215b may be configured to correspond to the configuration of the SSD input/output terminals 210a (of FIG. 4A).

Figure 4D:
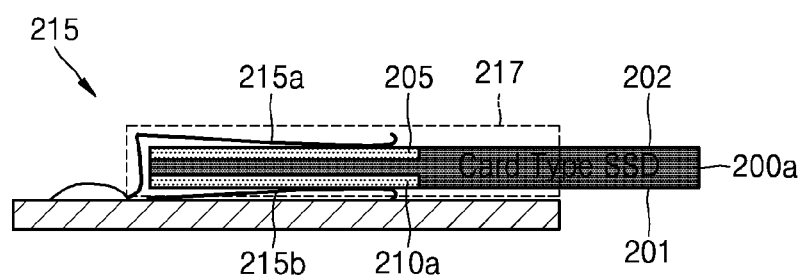
FIGS. 4D and 4E are respectively side cross-sectional views illustrating states in which a solid state drive (SSD) card and an SD card are inserted into the hybrid interface socket.
Figure 4E:
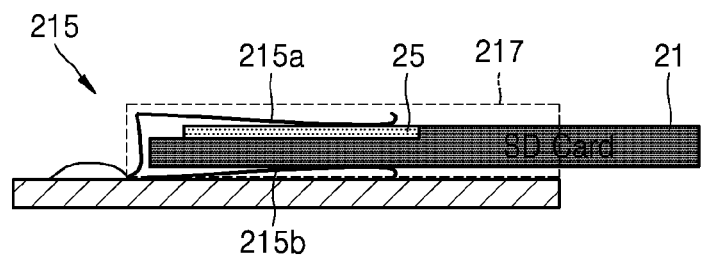

FIGS. 4D and 4E are respectively side cross-sectional views illustrating states in which an SSD card 200a and an SD card 21 are inserted into the hybrid interface socket 215.

Referring to FIG. 4D, the SSD input/output terminals 210a may be connected to the SSD card interface 215b. Also, a terminal shared with the SD card, such as the power terminal 205, may contact the SD card interface 215a.

Referring to FIG. 4E, terminals 25 of an SD card 21 contact the SD card interface 215a, and the SSD input/output terminals 210a do not contact the terminals 25 of the SD card 21.

As can be seen in FIGS. 4D and 4E, when the SD card 21 is inserted into the hybrid interface socket 215, the hybrid interface socket 215 can function as an SD card socket. Moreover, when the SSD card 200a is inserted into the hybrid interface socket 215, the hybrid interface socket 215 can function as an SSD card socket.

Figure 5A:
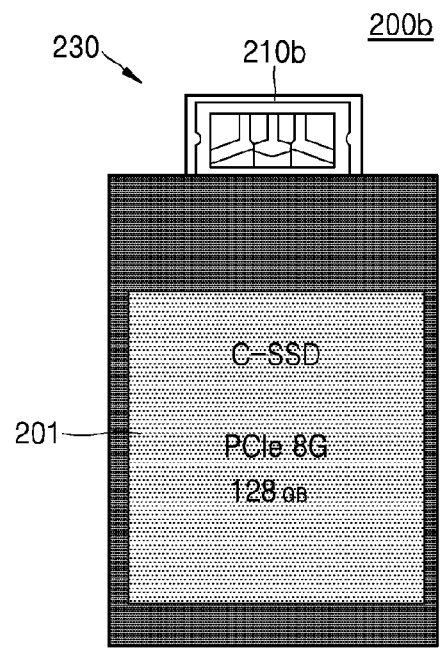
FIGS. 5A and 5B are respectively a top view and a bottom view illustrating a non-SD card according to another embodiment of the inventive concept.
Figure 5B:
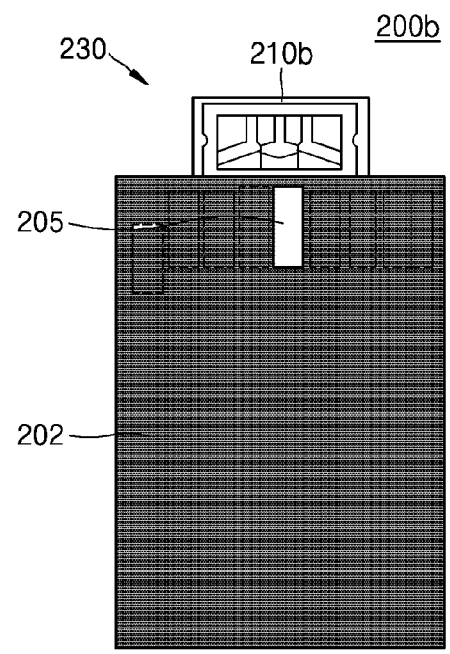

FIGS. 5A and 5B are respectively a top view and a bottom view illustrating a non-SD card according to another embodiment of the inventive concept.

Referring to FIG. 5A, an SSD card 200b may have a protrusion portion 230 that protrudes to a side surface in an insertion direction thereof. The protrusion 230 may have a smaller width than the SSD card 200b. FIG. 5A illustrates that the protrusion portion 230 is disposed at a center of the SSD card 200b. It will be understood, however, that the protrusion portion 230 may be disposed at the left or right side in the insertion direction of the SSD card 200b.

SSD input/output terminals 210b may be provided on one surface of the protrusion portion 230 or on both surfaces of the protrusion portion 230. The SSD input/output terminals 210b may have a different configuration than SD card terminals.

Referring to FIG. 5B, a power terminal 205 of an SSD card may be provided on a second surface 202 of the SSD card 200b. Since the power terminal 205 is located at the same position as the power terminal of the SD card, a power terminal of an SD card interface 215a (as further described below with reference to FIG. 5C) may be shared. An example of sharing the power terminal is described herein. It will be understood, however, that other terminals such as a ground terminal and/or a clock terminal may be shared.

Figure 5C:
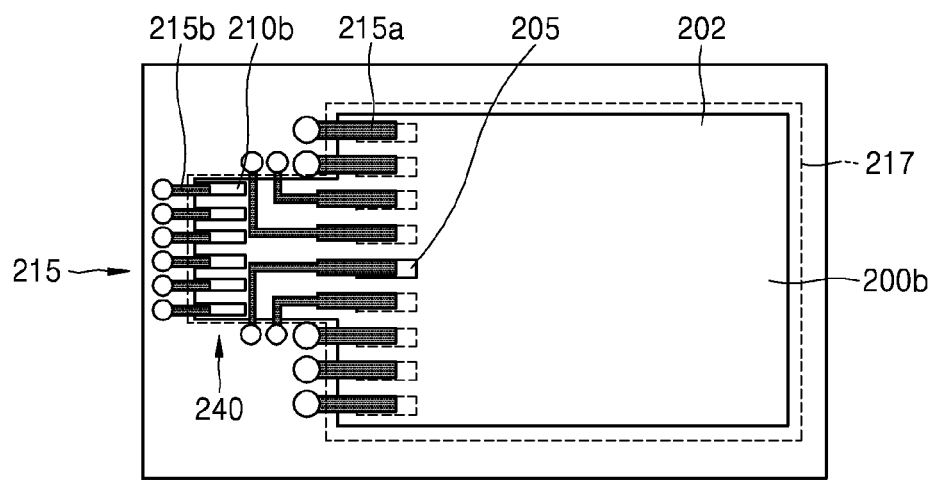
FIGS. 5C and 5D are respectively plan views illustrating states in which an SSD card and an SD card are inserted into a hybrid interface socket that may receive an SSD card of FIGS. 5A and 5B.
Figure 5D:
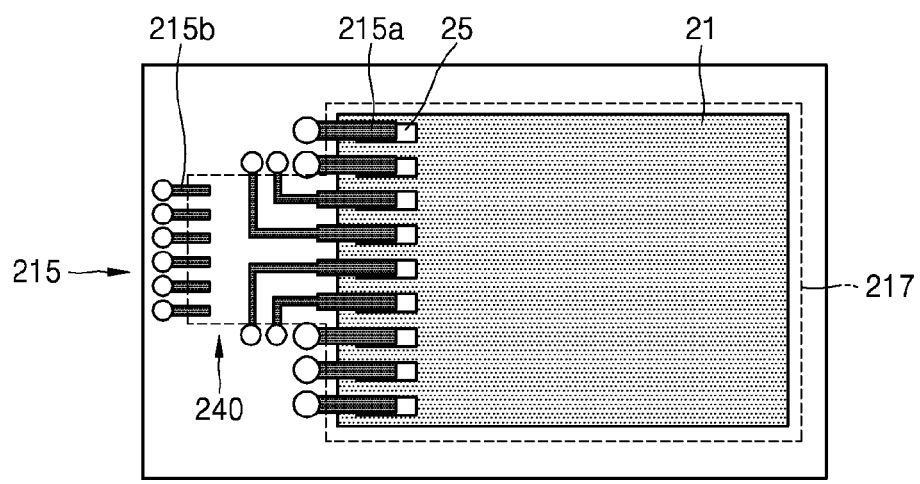

FIGS. 5C and 5D are respectively plan views illustrating states in which an SSD card 200b and an SD card 21 are inserted into the hybrid interface socket 215 that may receive the SSD card 200b of FIGS. 5A and 5B.

Referring to FIG. 5C, an SSD card 200b can be inserted into a housing 217 represented by a dotted line. The protrusion portion 230 can be received in a recess portion 240 inside the housing 217. The SSD input/output terminals 210b of the SSD card 200b can be connected to the SSD card interface 215b. The hybrid interface socket 215 may be configured to receive the protrusion portion 230 in the recess portion 240. The SSD card interface 215b may be provided in the recess portion 240. The SSD card interface 215b may correspond to the configuration of the SSD input/output terminals 210b. Also, a terminal shared with the SD card, such as the power terminal 205, may be disposed at a position contacting the SD card interface 215a.

Referring to FIG. 5D, the SD card 21 may be inserted into a housing 217 represented by a dotted line. The terminals 25 of the SD card 21 may contact the SD card interface 215a. Also, among the terminals 25 of the SD card 21 (e.g., data input/output terminals) may be configured not to contact the SSD card interface 215b. In particular, the SSD card interface 215b connected to the data input/output terminals of the SSD card 200b may be disposed in the recess portion 240.

The SSD input/output terminals 210b may have a non-uniform size and shape as illustrated in FIGS. 5A and 5B, or may have a uniform size and shape as illustrated in FIG. 5C.

As can be seen in FIGS. 5C and 5D, when the SD card 21 is inserted into the hybrid interface socket 215, the hybrid interface socket 215 can function as an SD card socket. Moreover, when the SSD card 200b is inserted into the hybrid interface socket 215, the hybrid interface socket 215 can function as an SSD card socket.

FIGS. 6A to 6D are respectively a top view, a bottom view, a first-direction side cross-sectional view, and a second-direction side cross-sectional view illustrating a non-SD card 200c according to another embodiment of the inventive concept.

Referring to FIGS. 6A to 6D, an SSD card 200c may have SSD input/output terminals 210c on a side surface thereof in an insertion direction thereof (a first-direction side surface). Alternatively, the SSD card 200c may have SSD input/output terminals 210c on a second-direction side surface that is adjacent to the first-direction side surface. Alternatively, the SSD card 200c may have SSD input/output terminals 210c on both the first-direction side surface and the second-direction side surface. Also, the SSD input/output terminals 210c may be provided at a right side surface or a left side surface with respect to the insertion direction of the SSD card 200c.

Figure 6A:
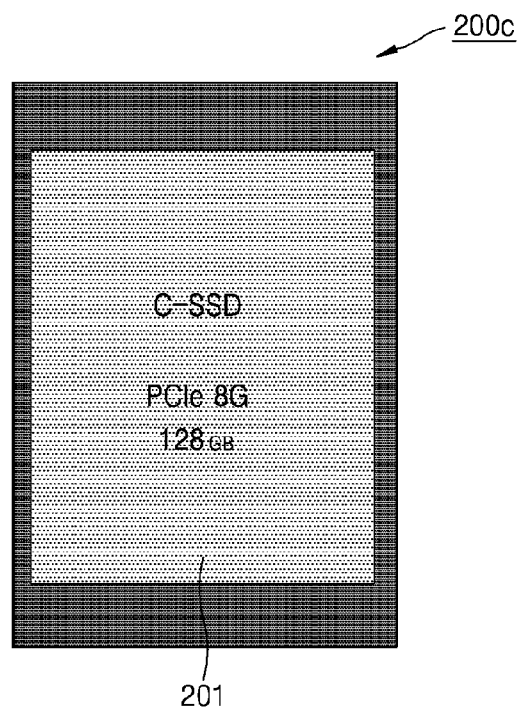
FIGS. 6A to 6D are respectively a top view, a bottom view, a first-direction side cross-sectional view, and a second-direction side cross-sectional view illustrating a non-SD card according to another embodiment of the inventive concept.
Figure 6B:
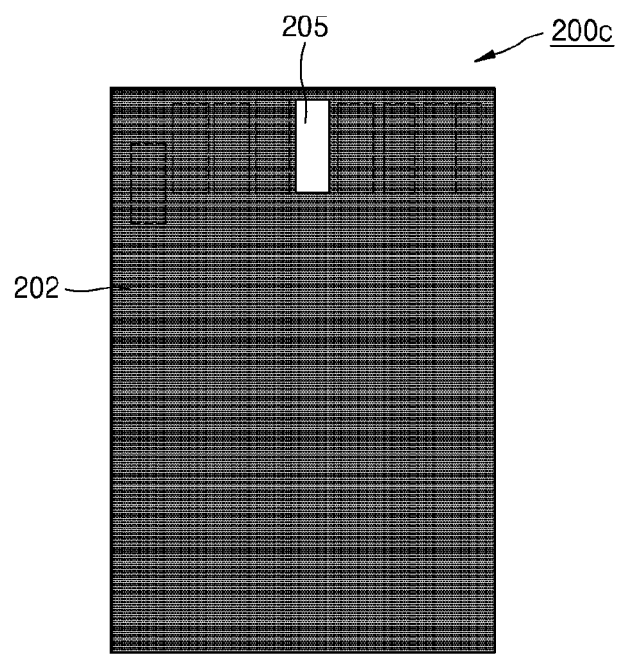
Figure 6C:
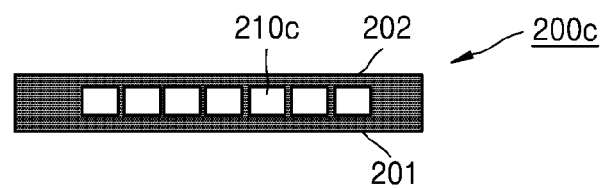
Figure 6D:
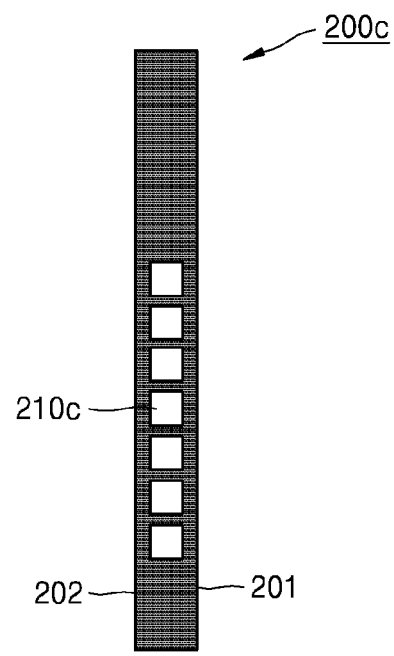

Referring to FIG. 6B, a power terminal 205 of an SSD card may be provided on a second surface 202 of the SSD card 200c. Since the power terminal 205 is located at the same position as the power terminal of the SD card, a power terminal of an SD card interface 215a (e.g., as described above with reference to FIG. 5E) may be shared. An example of sharing the power terminal is described herein. It will be understood, however, that other terminals such as a ground terminal and/or a clock terminal may be shared.

Figure 6E:
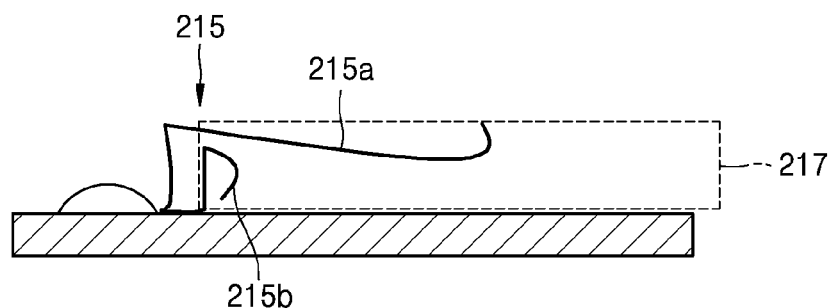
FIGS. 6E and 6F are respectively a side cross-sectional view and a plan view illustrating a hybrid interface socket into which an SSD card or an SD card is not inserted.
Figure 6F:
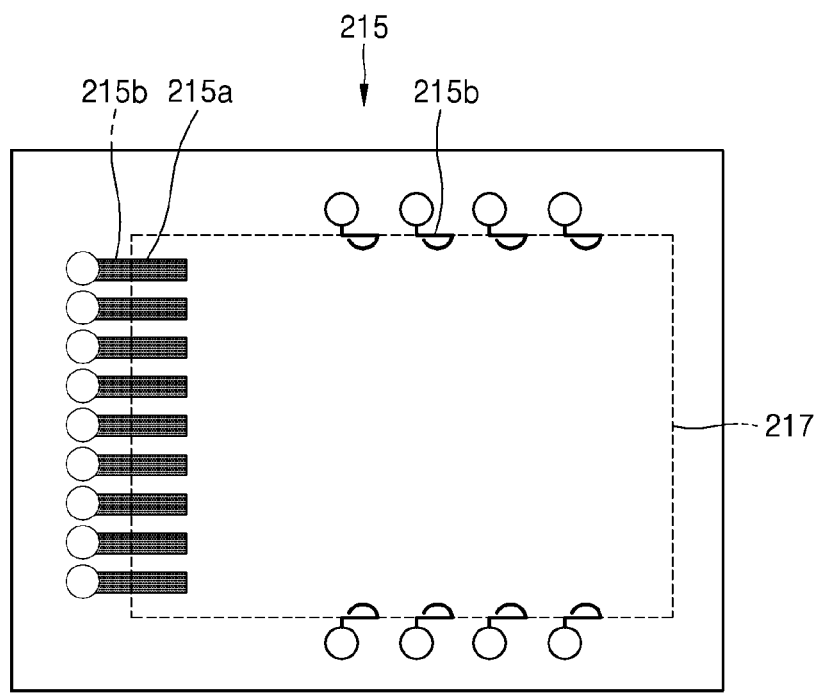

FIGS. 6E and 6F are respectively a side cross-sectional view and a plan view illustrating a hybrid interface socket 215 into which an SSD card or an SD card is not inserted.

Referring to FIGS. 6E and 6F, an SD card or an SSD card may be inserted into a housing 217 represented by a dotted line. An SD card interface 215a may be disposed at the position where the terminals of the SD card are located. FIG. 6E illustrates that the SD card interface 215a is configured to be elastically connectable. It will be understood, however, that the SD card interface 215a may be configured in any suitable way.

Also, an SSD card interface 215b may be disposed at a position corresponding to the SSD input/output terminals that are disposed at the first-direction side surface and the second-direction side surface of the SSD card. In particular, FIG. 6E illustrates an SSD card interface 215b corresponding to the SSD input/output terminals 210c disposed at the first-direction side surface. FIG. 6F illustrates an SSD card interface 215b corresponding to the SSD input/output terminals 210c disposed at the second-direction side surface. In FIG. 6F, the SSD card interface 215b corresponding to the SSD input/output terminals 210c disposed at the first-direction side surface may be disposed under the SD card interface 215a with respect to the direction of the line of sight.

Figure 6G:
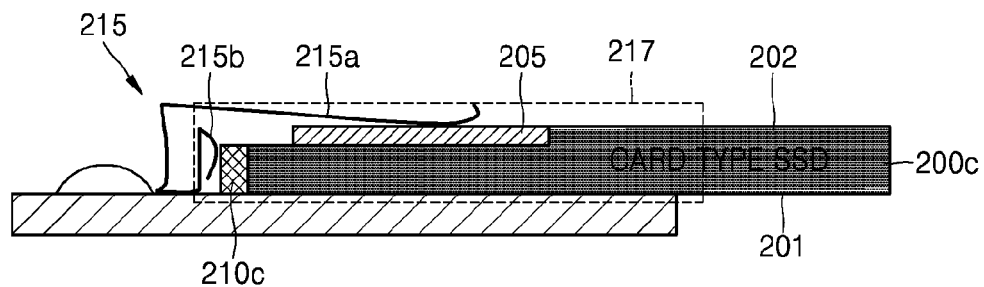
FIGS. 6G and 6H are respectively a side cross-sectional view and a plan view illustrating a state in which an SSD card is inserted into the hybrid interface socket.
Figure 6H:
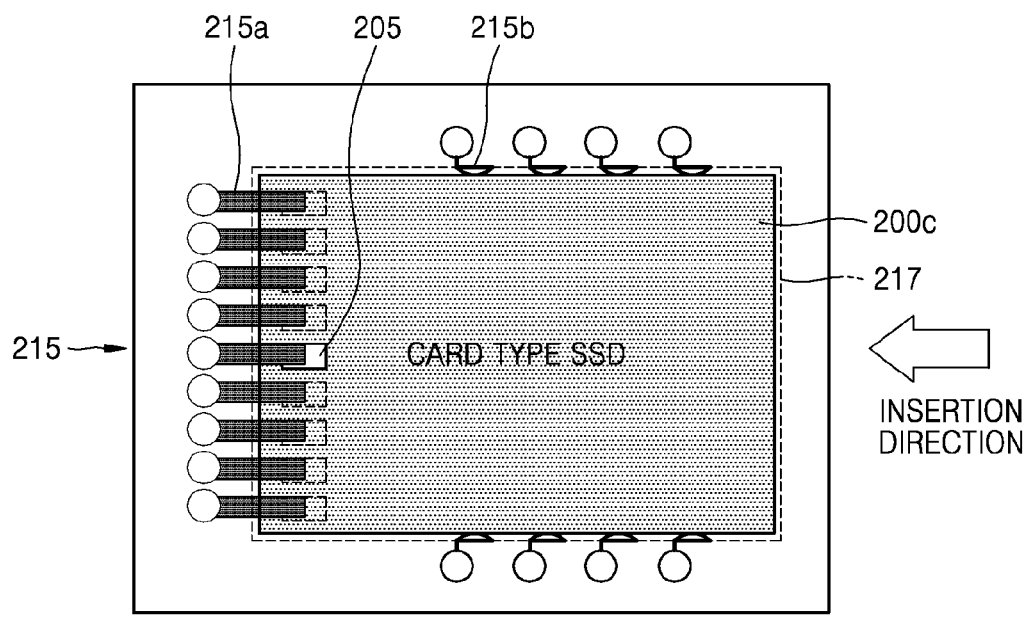

FIGS. 6G and 6H are respectively a side cross-sectional view and a plan view illustrating a state in which an SSD card 200c can be inserted into the hybrid interface socket 215.

Referring to FIGS. 6G to 6H, an SSD card 200c has SSD input/output terminals 210c on a first-direction side surface. Also, as described above with reference to FIG. 6B, a power terminal 205 of an SSD card may be provided on a second surface 202 thereof. Accordingly, the power terminal 205 of the SSD card may contact a pin terminal corresponding to the power terminal of the SD card interface 215a. However, pin terminals other than the pin terminal corresponding to the power terminal of the SD card interface 215a may not contact the terminal of the SSD card.

Figure 6I:
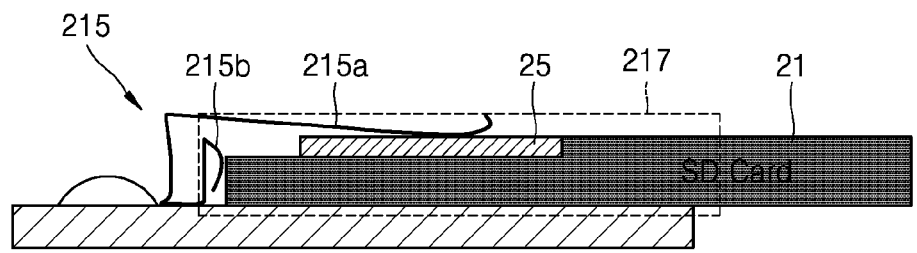
FIG. 6I is a side cross-sectional view illustrating a state in which an SD card is inserted into the hybrid interface socket.

FIG. 6I is a side cross-sectional view illustrating a state in which an SD card can be inserted into the hybrid interface socket 215.

Referring to FIG. 6I, terminals 25 are formed at a surface of the SD card facing the SD card interface 215a. Conduction via the terminals 25 can be provided by elastic contact. However, since no terminal is formed at the first-direction side surface of the SD card 21 (i.e., insulation is provided instead), signal communication is impossible even when the SD card 21 contacts the SSD card interface 215b. The same is true for the second-direction side surface of the SD card 21. That is, unlike the SSD card 200c having the SSD input/output terminals 210c at the second-direction side surface, since the second-direction side surface of the SD card 21 illustrated in FIG. 6H is electrically insulated, signal communication is impossible even when contacting the SSD card interface 215b.

As can be seen in FIGS. 6G to 6I, when the SD card 21 is inserted into the hybrid interface socket 215, the hybrid interface socket 215 can function as an SD card socket. Moreover, when the SSD card 200c is inserted into the hybrid interface socket 215, the hybrid interface socket 215 can function as an SSD card socket.

Figure 7A:
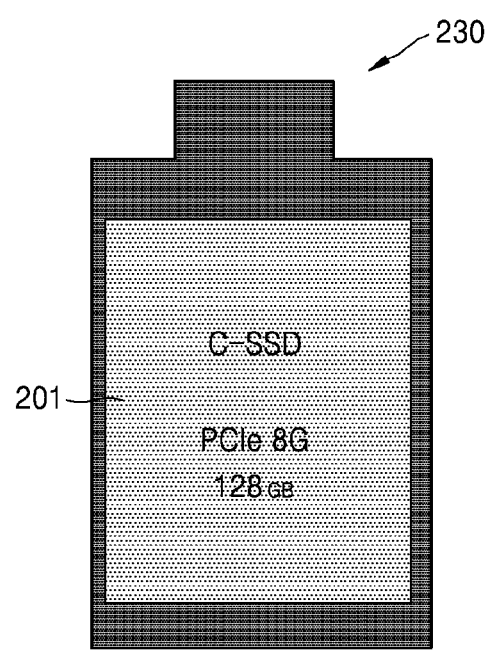
FIGS. 7A and 7B are respectively a top view and a bottom view illustrating a non-SD card according to another embodiment of the inventive concept.
Figure 7B:
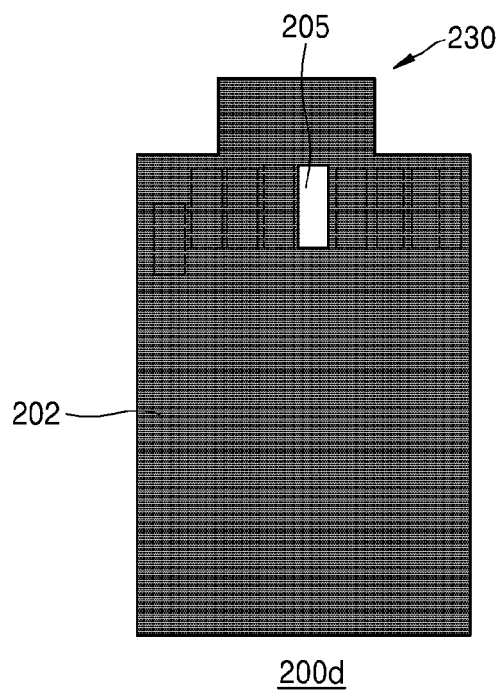
Figure 7C:
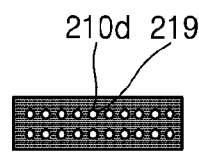
FIG. 7C is a side cross-sectional view illustrating a first-direction side of the non-SD card of FIG. 7A.

FIGS. 7A and 7B are respectively a top view and a bottom view illustrating a non-SD card according to another embodiment of the inventive concept. FIG. 7C is a side cross-sectional view illustrating a first-direction side of the non-SD card of FIG. 7A.

Referring to FIGS. 7A to 7C, an SSD card 200d may have a protrusion portion 230 that protrudes to a side surface in an insertion direction thereof. FIGS. 7A to 7C illustrate that the protrusion portion 230 has a smaller width than the SSD card 200d. It will be understood, however, that embodiments of the inventive concept are not limited thereto. FIGS. 7A and 7B illustrate that the protrusion portion 230 is disposed at a center of the SSD card 200d. It will be understood, however, that the protrusion portion 230 may be disposed at the left or right side in the insertion direction of the SSD card 200d.

SSD input/output terminals 210d may be provided in a hole 219 provided at the protrusion portion 230. An SSD card interface 215c (of FIG. 7D) may be provided in the form of an inserted pin as described below in detail.

Referring to FIG. 7B, a power terminal 205 of an SSD card may be provided on a second surface 202 of the SSD card 200d. Since the power terminal 205 is located at the same position as the power terminal of the SD card, a power terminal of an SD card interface 215a (of FIG. 7D) may be shared. An example of sharing the power terminal is described herein. It will be understood, however, that other terminals such as a ground terminal and a clock terminal may be shared.

Figure 7D:
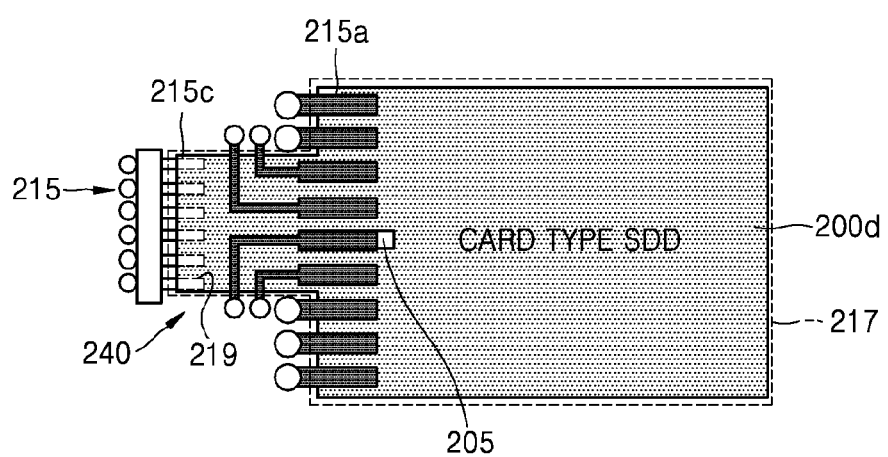
FIGS. 7D and 7E are respectively plan views illustrating states in which an SSD card and an SD card are inserted into a hybrid interface socket that may receive an SSD card of FIGS. 7A and 7B.
Figure 7E:
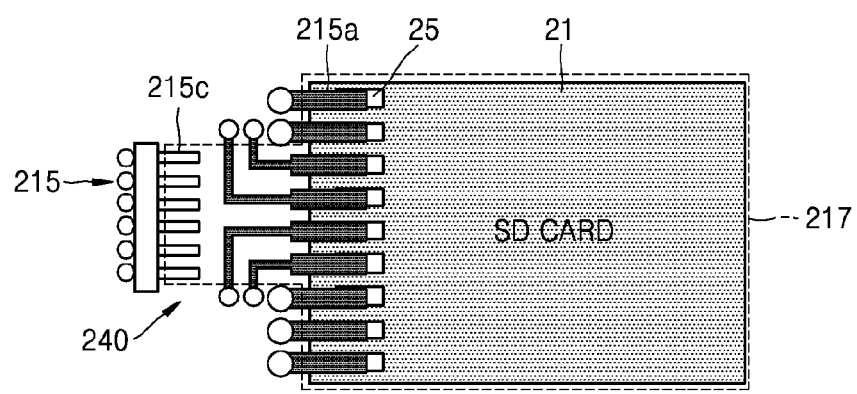

FIGS. 7D and 7E are respectively plan views illustrating states in which an SSD card 200d and an SD card 21 are inserted into the hybrid interface socket 215 that may receive the SSD card 200d of FIGS. 7A and 7B.

Referring to FIG. 7D, an SSD card 200d can be inserted into a housing 217 represented by a dotted line. SSD input/output terminals 210d of the SSD card 200d can be connected to the SSD card interface 215c. As described above, the SSD input/output terminals 210d may be provided in the hole 219 provided at the protrusion portion 230. Also, the SSD card interface 215c may have the shape of a pin to be insertable into the hole 219.

As illustrated in FIG. 7D, the SSD card interface 215c may be inserted into the hole 219 and connected to the SSD input/output terminals 210d inside the hole 219.

Also, as described with reference to FIG. 7B, a power terminal 205 of an SSD card may be provided on a second surface 202 thereof. Accordingly, the power terminal 205 of the SSD card may contact a pin terminal corresponding to the power terminal of the SD card interface 215a. It will be understood, however, that pin terminals other than the pin terminal corresponding to the power terminal of the SD card interface 215a may not contact the terminal of the SSD card.

Referring to FIG. 7E, the SD card 21 can be inserted into a housing 217 represented by a dotted line. The terminals 25 of the SD card 21 can be connected to the SD card interface 215a. Among the terminals 25 of the SD card 21, data input/output terminals may be configured not to contact the SSD card interface 215c. In particular, among the terminals of the SSD card interface 215c, terminals connected to the data input/output terminals of the SSD card 200d illustrated in FIG. 7D may be disposed in the recess portion 240.

As can be seen in FIGS. 7D and 7E, when the SD card 21 is inserted into the hybrid interface socket 215, the hybrid interface socket 215 can function as an SD card socket. Moreover, when the SSD card 200d is inserted into the hybrid interface socket 215, the hybrid interface socket 215 can function as an SSD card socket.

Since the above-described SSD cards 200a, 200b, 200c and 200d have a larger capacity than a general SD card, a large storage capacity may be easily achieved. Therefore, when a storage capacity of an electronic system such as a computer system is upgraded, the upgrade is possible merely by the insertion of an SSD card and thus the upgrade may be conveniently performed.

Most notebook computers are provided with an SD card socket. When the hybrid interface socket 215 is provided in place of a conventional SD card socket, not only an SD card but also an SSD card may be used, thus improving space efficiency.

Since the SSD cards 200a, 200b, 200c and 200d may operate at a speed of about 600 Mbps or more, they may provide a significantly higher communication speed than the SD card that operates at a speed of about 100 Mbps or less. Hereinafter, the SSD cards 200a, 200b, 200c and 200d will be described in more detail.

Figure 8:
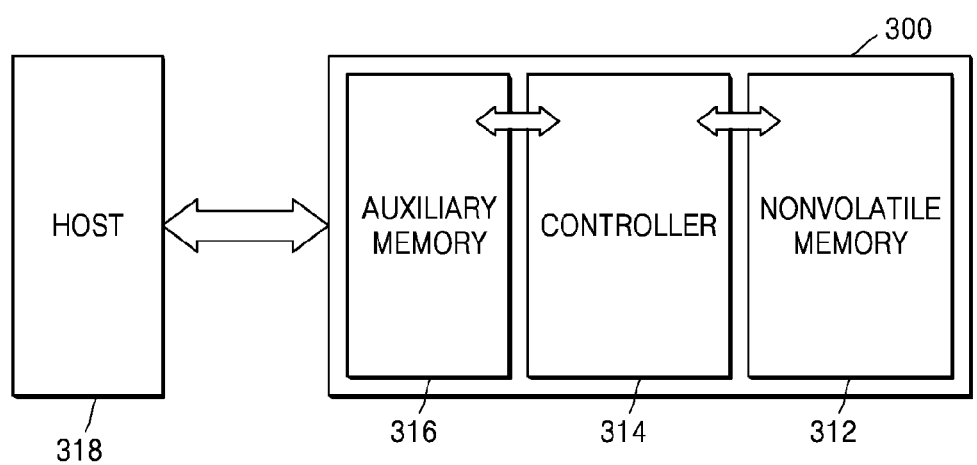
FIG. 8 is a schematic block diagram illustrating a relation between an external system and main components of an SSD card according to an embodiment of the inventive concept.

FIG. 8 is a schematic block diagram illustrating a relation between an external system and main components of an SSD card 300 according to an embodiment of the inventive concept.

Referring to FIG. 8, the SSD card 300 may include a nonvolatile memory 312 configured to store data, and a controller 314 configured to control a data input/output to and/or from the nonvolatile memory 312. Alternatively, the SSD card 300 may further include an auxiliary memory 316 configured to buffer a difference between a data transmission rate and a data read and/or storage rate between the controller 314 and the nonvolatile memory 312. For example, the auxiliary memory 316 may be a dynamic RAM (DRAM).

As illustrated in FIG. 8, data input from an external memory may be stored in the nonvolatile memory 312 through the auxiliary memory 316 and the controller 314. The controller 314 may read data from the nonvolatile memory 316 and transfer the read data to the external system (e.g., host 318) through the auxiliary memory 316. Moreover, the SSD card 300 may receive data from the external system (e.g., host 318) and store the data in the nonvolatile memory 316.

Figure 9:
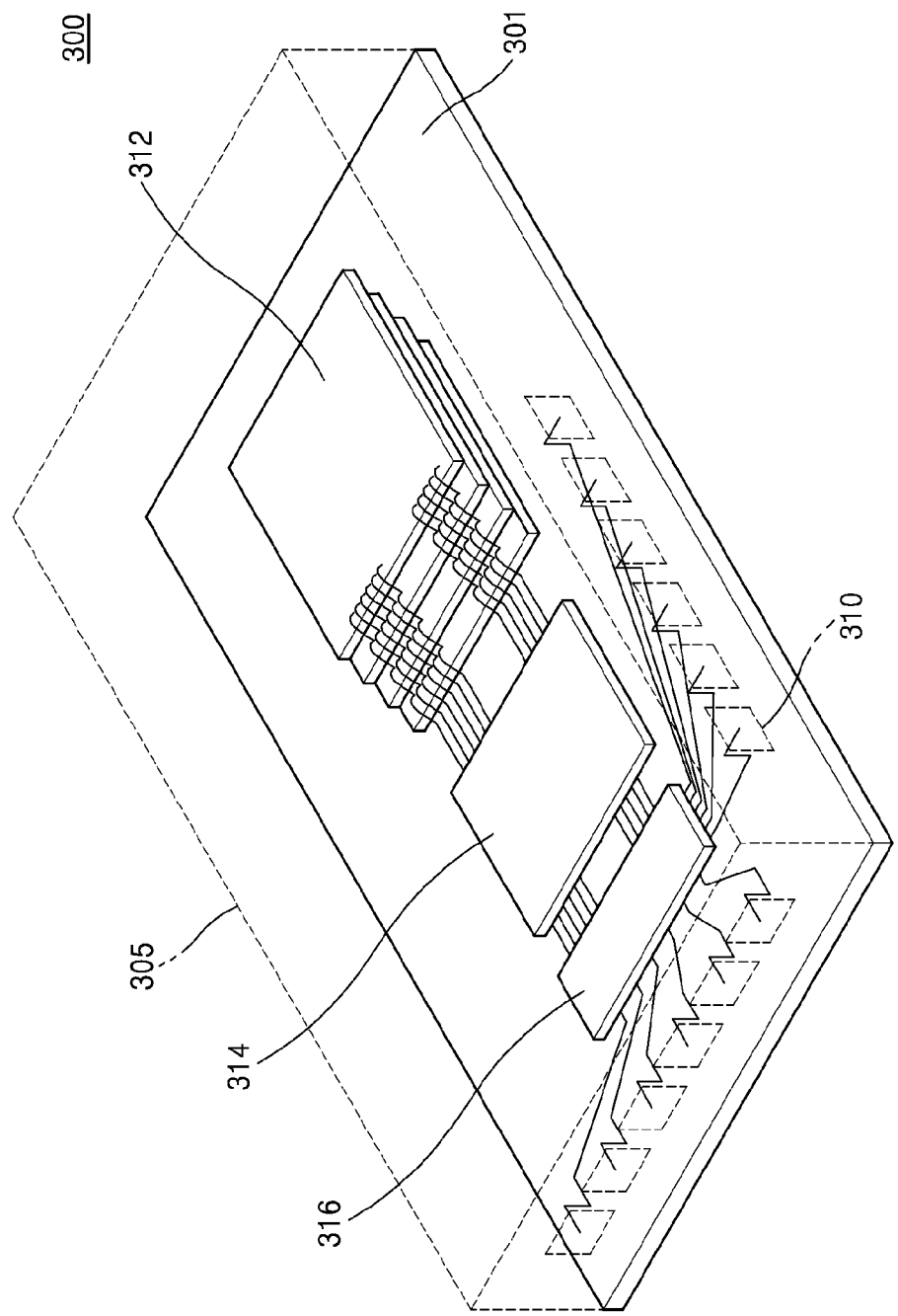
FIG. 9 is a conceptual perspective view illustrating an SSD card according to an embodiment of the inventive concept.

FIG. 9 is a conceptual perspective view illustrating an SSD card 300 according to an embodiment of the inventive concept.

Referring to FIG. 9, a plurality of nonvolatile memories 312 may be stacked on a package substrate 301. For example, the package substrate 301 may be a printed circuit board (PCB) or a flexible printed circuit board (FPCB).

For example, the nonvolatile memories 312 may be flash memories, phase-change RAMs (PRAMs), resistive RAMs (RRAMs), ferroelectric RAMs (FeRAMs), magnetic RAMs (MRAMs), or the like. For example, the flash memories may be NAND flash memories.

A controller 314 and an auxiliary memory 316 may be further provided on the package substrate 301. For example, the auxiliary memory 316 may be a module of a DRAM device.

The controller 314 may manage the input/output of data exchanged with the outside, and may control the read/storage of data from/into the nonvolatile memories 312. In addition, the controller 314 may perform functions of wear levelling, error correction, and/or fail block control.

The SSD card 300 may be configured to communicate with external devices through SSD input/output terminals 310.

The nonvolatile memories 312, the controller 314, and the auxiliary memory 316 may be sealed by a molding sealing member 305 so that they may be protected from external impact, moisture and heat.

While the inventive concept has been particularly shown and described with reference to exemplary embodiments thereof, it will be understood that various changes in form and details may be made therein without departing from the spirit and scope of the following claims.

What is claimed is:

1. An electronic system, comprising:
   a main board to which an input device and an output device are connected;
   a hybrid interface socket;
   a central processing unit provided on the main board; and
   a platform hub provided on the main board, the platform hub being electrically connected to the hybrid interface socket and to the central processing unit,
   wherein the hybrid interface socket comprises a secure digital (SD) card interface and a non-SD card interface,
   wherein the non-SD card interface of the hybrid interface socket comprises a solid state drive (SSD) card interface, and
   wherein the hybrid interface socket is configured to receive an SSD card comprising a first surface and a second surface as two opposite main surfaces such that the SSD card is electrically communicable with the SSD card interface.

2. The electronic system of claim 1, wherein:
   the SD card interface is provided at a side opposite to the second surface of the SSD card; and
   the SSD card interface is provided at a side opposite to the first surface of the SSD card.

3. The electronic system of claim 2, further comprising the SSD card inserted into the hybrid interface socket, wherein:
   the second surface of the SSD card is opposite to the SD card,
   the first surface of the SSD card comprises SSD input/output terminals, and
   the SSD input/output terminals are electrically communicably connected to the SSD card interface.

4. The electronic system of claim 1, wherein the hybrid interface socket comprises a recess portion configured to receive a protrusion portion of the SSD card that protrudes to a side surface or a front surface of the SSD card in an insertion direction of the SSD card, and
   the SSD card interface is provided at the recess portion.

5. The electronic system of claim 4, further comprising the SSD card inserted into the hybrid interface socket, wherein the SSD card comprises:
   the protrusion portion provided at the side surface or the front surface of the SSD card in the insertion direction of the SSD card into the hybrid interface socket; and
   SSD input/output terminals provided on at least one of a first surface and a second surface of the protrusion portion,
   wherein the SSD input/output terminals are electrically communicable with the SSD card interface.

6. The electronic system of claim 1, wherein:
   the hybrid interface socket comprises the SSD card interface, and
   the SSD card interface is configured to be contactable with a side surface or a front surface of the SSD card.

7. The electronic system of claim 6, further comprising the SSD card inserted into the hybrid interface socket, wherein:
   the SSD card comprises SSD input/output terminals provided at a side surface of the SSD card, and
   the SSD input/output terminals are electrically communicable with the SSD card interface.

8. The electronic system of claim 6, wherein the SSD card interface comprises pins that are insertable into the side surface or the front surface of the SSD card in an insertion direction of the SSD card into the hybrid interface socket.

9. The electronic system of claim 8, further comprising the SSD card inserted into the hybrid interface socket, wherein the SSD card comprises:
   holes which are provided at the side surface of the SSD card in the insertion direction of the SSD card into the hybrid interface socket and into which the pins of the SSD card interface are insertable; and
   SSD input/output terminals provided in the holes.

10. The electronic system of claim 1, wherein:
    the SD card interface is electrically connected to the platform hub through a first route, and
    the non-SD card interface is electrically connected to the platform hub through a second route.

11. The electronic system of claim 10, wherein the SD card interface is electrically connected to the platform hub through a Universal Serial Bus (USB) bridge chip.

12. The electronic system of claim 1, wherein an interface for connecting the non-SD card interface to the platform hub conforms to Serial Advanced Technology Attachment (SATA) standards or Peripheral Component Interconnection (PCI) standards.

13. The electronic system of claim 1, wherein the SD card interface and the non-SD card interface are configured to share a power terminal.

* * * * *